United States Patent
Tonosaki et al.

(10) Patent No.: US 6,555,182 B1
(45) Date of Patent: Apr. 29, 2003

(54) SURFACE HARDENED RESINS FOR DISK SUBSTRATES, METHODS OF MANUFACTURE THEREOF AND PRODUCTION DEVICES FOR THE MANUFACTURE THEREOF

(75) Inventors: Minehiro Tonosaki, Kanagawa (JP); Yutaka Takei, Tokyo (JP); Hiroyuki Okita, Kanagawa (JP); Yuji Horino, Osaka (JP); Akiyoshi Chayahara, Osaka (JP); Atsushi Kinomura, Osaka (JP); Nobuteru Tsubouchi, Osaka (JP)

(73) Assignees: Sony Corporation, Tokyo (JP); Agency of Industrial Science and Technology, Tokyo (JP)

( * ) Notice: Subject to any disclaimer, the term of this patent is extended or adjusted under 35 U.S.C. 154(b) by 0 days.

(21) Appl. No.: 09/346,078

(22) Filed: Jul. 1, 1999

(30) Foreign Application Priority Data

Jul. 3, 1998 (JP) ............................. 10-189208
Jan. 11, 1999 (JP) ............................. 11-004049

(51) Int. Cl.[7] .................... C23C 14/02; C23C 14/30; C23C 14/48; C23C 14/58; C08J 7/18
(52) U.S. Cl. .................... 427/525; 427/487; 427/531; 427/533; 427/566
(58) Field of Search .................... 427/525, 531, 427/530, 491, 487, 566, 580, 533, 536, 537

(56) References Cited

U.S. PATENT DOCUMENTS

| | | | | |
|---|---|---|---|---|
| 4,256,780 A | * | 3/1981 | Gaerttner et al. | 427/525 |
| 4,395,465 A | * | 7/1983 | Takagi et al. | 427/525 |
| 4,410,611 A | * | 10/1983 | MacIver | 427/525 |
| 4,743,493 A | * | 5/1988 | Sloshansi et al. | 427/525 |
| 4,751,100 A | * | 6/1988 | Ogawa | 427/525 |
| 4,815,962 A | * | 3/1989 | Cardone | 427/525 |
| 4,886,681 A | * | 12/1989 | Clabes et al. | 427/525 |
| 5,087,476 A | * | 2/1992 | Tohma et al. | 427/525 |
| 5,389,195 A | * | 2/1995 | Guderkirk et al. | 427/525 |
| 5,407,992 A | * | 4/1995 | Lee et al. | 427/525 |
| 5,474,797 A | * | 12/1995 | Sloshansi et al. | 427/525 |
| 5,683,757 A | * | 11/1997 | Iskanderova et al. | 427/525 |

FOREIGN PATENT DOCUMENTS

JP 401208730 * 8/1989 ............ 427/525

OTHER PUBLICATIONS

*Hackh's Chemical Dictionary*, 3rd ed, J. Grant editor, McGraw–Hill Book Co., Inc, NY, excerpt p. 17, no month 1944.*

* cited by examiner

*Primary Examiner*—Marianne Padgett
(74) *Attorney, Agent, or Firm*—Sonnenschein, Nath & Rosenthal

(57) ABSTRACT

A surface hardening method for resins and a surface hardened resin, capable of reforming the surface of a plastic disk substrate at low energy in a short time, and a production device of such a resin is disclosed. The formation of an ion-implanted layer 11 by implanting equal to or more than $10^{17}$ carbon ions per $cm^2$ into the surface of a plastic disk substrate 10 at equal to or less than 20 KeV and the formation of a thin film 12 of high hardness on the ion-implanted layer 11 can be performed alternately or simultaneously, and the hardening rate is increased further by using a bias device.

21 Claims, 10 Drawing Sheets

Ion Implanting Process

Film Depositing Process

Ion Implanting Process

Ion Implanting and Film Depositing Process

Untreated Plastic Substrate

FIG. 11

Plastic Substrate Subjected to Only Implantation of Example 7

SURFACE HARDENED RESINS FOR DISK SUBSTRATES, METHODS OF MANUFACTURE THEREOF AND PRODUCTION DEVICES FOR THE MANUFACTURE THEREOF

BACKGROUND OF THE INVENTION

1. Field of the Invention

The present invention relates to a surface hardening method for resins used, for example, as an optical disk substrate, magnetic disk or magneto-optical disk substrate, a surface hardened resin, a production device of the surface hardened resin, and an information carrier-use resin disk substrate used therein.

2. Description of the Related Art

Conventionally, aluminum, glass, etc. have been used for an optical disk substrate, magnetic disk or magneto-optical disk substrate because such materials are easily processed to have rigidity, smoothness and so on. In recent years, however, a resin substrate has been proposed because it is inexpensive and allows pits and grooves to be formed easily by the injection molding.

Although such a resin disk substrate is inexpensively producible, it is easily deformed by external forces. Thus, it is necessary to perform a surface hardening treatment for the resin disk substrate.

However, conventionally, in order to reform the physical properties of the surface of plastics, ion implantation is simply performed by implanting ions at a certain energy level (between several tens KeV to several MeV).

A method of hardening only the vicinity of the surface to a sufficient surface hardness has not been established at present.

SUMMARY OF THE INVENTION

Then, an objective of the present invention is to provide a surface hardening method for resins and a surface hardened resin, which are capable of reforming the surface of an object to be treated under low energy in a short time, a production device of the surface hardened resin, and an information carrier-use resin disk substrate.

The present inventors noted recently-studied techniques of implanting ions into plastic materials. For example, see Proceedings at the 45th Meeting of the Affiliated Association of Applied Physics Society, Riken, Iwaki, No. 2, p. 687 29-p-ZB-10; and Thin Film Tripology (Tokyo University Publishing), p.128, S. hibi, The 18th symp. on ion implantation and submicron fabrication, Rikagaku Kenkyusho, 1987, 81. These techniques have been studied and the application of such techniques have been directed to a disk-shaped information carrier. As a result, the inventors found that it is possible to reform the surfaces of resins and obtain disk-shaped substrates with surfaces which do not have cracks or plastic deformation, by implanting ions such as carbon ions, argon ions, nitrogen ions, silicon ions, etc. into the entire surface of substrates made of resins, such as acrylic-based resins, polyethylene terephthalate, polycarbonate, amorphous polyolefine, and high-density polyethylene, at least on a side which supports an information recording layer.

Moreover, the present invention relates to a surface hardening method for resins, for hardening the surface of a resin to be treated, by performing alternately ion implantation and physical film deposition under a different condition from that for the ion implantation on the resin (hereinafter referred to as the "hardening method 1" of the present invention).

In addition, the present invention relates to a surface hardening method for resin, for hardening the surface of a resin to be treated, by simultaneously performing ion implantation and physical film deposition on the resin (hereinafter referred to as the "hardening method 2" of the present invention).

Furthermore, the present invention relates to a surface hardening method for resins, for hardening the surface of a resin to be treated, by performing ion implantation on the resin under the influence of a bias electric field (hereinafter referred to as the "hardening method 3" of the present invention).

According to the hardening methods 1, 2 and 3 of the present invention, since ion implantation and physical film deposition under a different condition are performed alternately or simultaneously, or ion implantation is performed under the influence of a bias electric field, a thin or shallow ion-implanted layer and a physically deposited film are formed on the surface of the resin alternately or simultaneously under low energy, and it is possible to harden the surface of the resin without producing a boundary face in substantially the same manner as in the case where the physically deposited film is formed on the ion-implanted layer. Moreover, if a bias electric field is applied, the implantation ions are accelerated and the implantation efficiency is improved, thereby increasing the hardening rate. Consequently, for example, if the surface of the resin is reformed to a material rich in the DLC (diamond like carbon) structure and if the resultant material is applied to a disk substrate, it is possible to fabricate a good-quality product having no cracks or the like in a short time, thereby improving the productivity.

Additionally, the present invention relates to a surface hardened resin formed by layering an ion-implanted resin of high hardness and a film layer of high hardness (hereinafter referred to as the "hardened resin" of the present invention).

Since the hardened resin of the present invention is a hardened resin produced by the above-mentioned surface hardening methods, it is possible to provide a satisfactory surface hardened resin having the same effects as the above-mentioned hardening methods.

Moreover, the present invention relates to a production device of a surface hardened resin (hereinafter referred to as the "Reproduction device 1" of the present invention) including an ion implanting means and a physical film depositing means operated under a different condition from that for the ion implanting means, the ion implanting means and the physical film depositing means being disposed to face a resin to be treated (both the means can be achieved by the same device).

Besides, the present invention relates to a production device of a surface hardened resin (hereinafter referred to as the "production device 2" of the present invention), which is designed to perform the ion implantation and the physical film deposition simultaneously on a resin to be treated.

Furthermore, the present invention relates to a production device of a surface hardened resin (hereinafter referred to as the "production device 3" of the present invention), which is designed to perform the ion implantation on a resin to be treated under the influence of a bias electric field.

With the production devices 1, 2 and 3 of the present invention, it is possible to provide a production device of good reproducibility according to the above-mentioned production methods.

Other objects and advantages of the invention will become apparent upon reading the following detailed description and a appended claims, and upon reference to the accompanying drawings.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

The following descriptions will explain presently preferred embodiments as examples of the present invention with reference to the drawings.

In the above-mentioned hardening methods, hardened resin and production devices of the present invention, it is preferred that the ion implantation and the physical film deposition mentioned above are performed repeatedly by varying the ion energy during the ion implantation by accelerating or decelerating ions. As the ion implanting means, it is possible to perform, for example, carbon ion implantation with a Freeman-type ion gun shown in FIG. 2, or accelerated ion implantation by ionizing carbon dioxide gas with a microwave-type ion gun, etc. and separating only the mass of carbons by a mass separating magnetic field.

Figure 2:
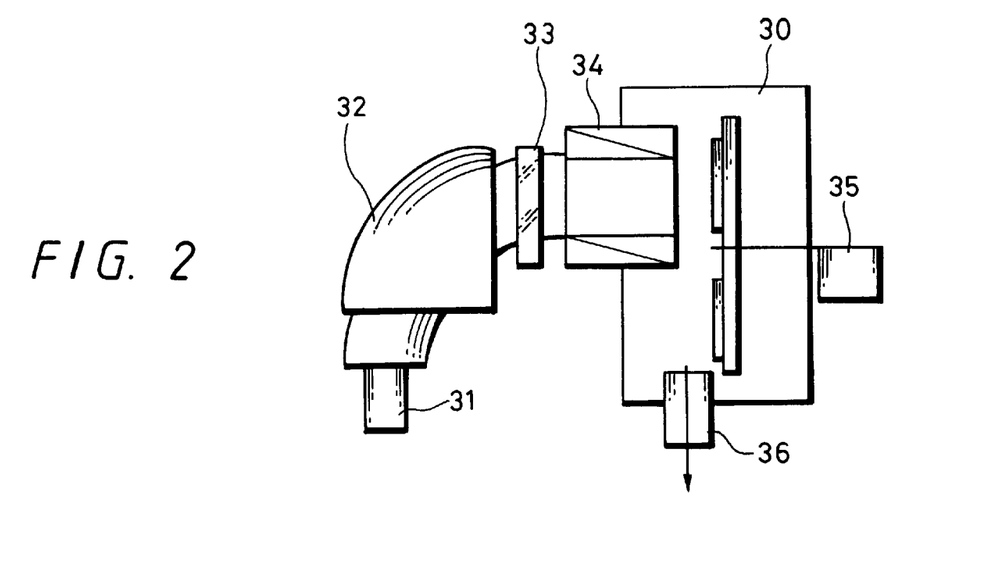
FIG. 2 is a schematic view of an ion implanting device used in the examples of the present invention.

In the ion implanting device shown in FIG. 2, ions fed from an ion source 31 are implanted into a substrate placed in a vacuum chamber 30 through a mass separating coil 32, an accelerating and decelerating lens 33 and a scanning coil 34. The substrate is held in a rotating manner by a substrate rotating palette 35, and the inside of the vacuum chamber 30 is made vacuum with an exhaust device 36. With the use of this device, the ion implantation and the physical film deposition can be performed by the same device by changing the ion energy, and if a later-described bias means is a also used, the ion implantation and the physical film deposition may be accelerated.

Figure 3:
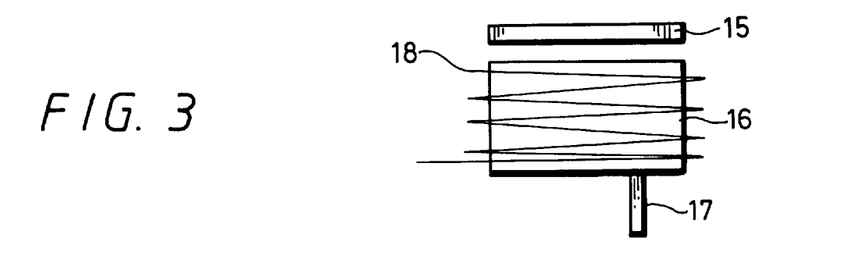
FIG. 3 is a schematic view of another ion implanting device which can be used in the examples of the present invention.

Moreover, as shown in, for example, FIG. 3, by simply providing a gas inlet tube 17 and a RF coil 18 inside and placing a grid 15 on a silica tube 16 capable of being set to be vacuum, it is possible to perform ion implantation by a simplified implanting method using no separating magnetic field, or with an arc-type ion implanting device capable of implanting polyvalent ions. Any of these devices can vary the ion energy by an accelerating electrode voltage and a decelerating electrode voltage.

Figure 4:
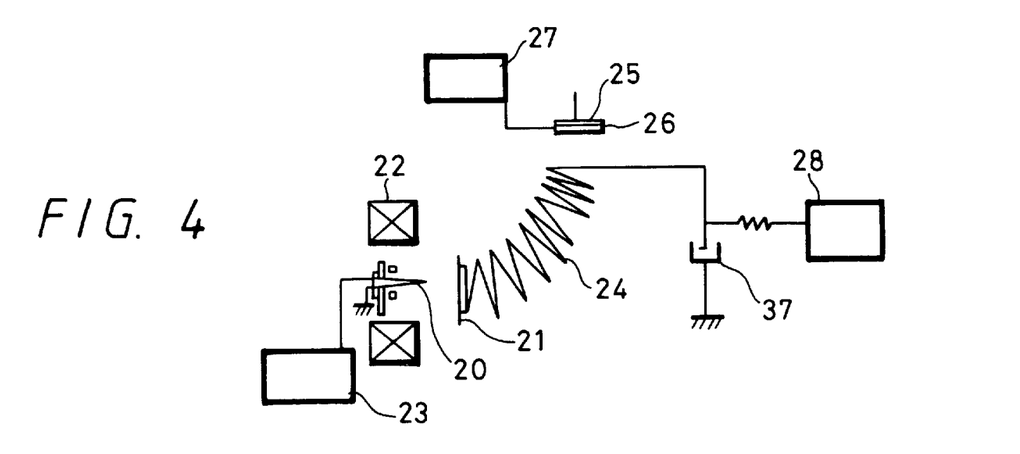
FIG. 4 is a schematic view of a film depositing device used in the examples of the present invention.

As the film depositing means, it is possible to use a vapor depositing means which includes an electron gun, laser or cathodic arc and does not use an operating gas shown in FIG. 4, or a Kauffmann-type ion source or magnetron sputter source when using the operating gas.

The device shown in FIG. 4 functions as an electromagnetic inducing system including a deflecting coil 22, disposed outside of a discharge-use cathode 20 to which a drive voltage is applied from a trigger power supply 23, for efficiently guiding ions generated from the cathode 20 to an anode 21; and an electromagnetic coil 24, disposed at the rear stage of the anode 21, for guiding the charged ions to a substrate 26. A substrate holder 25 and a power supply 27 function as the later-described bias means, and a power supply 28 is a power supply for applying a drive voltage to the electromagnetic coil 24 and forms a low-voltage circuit through a capacitor 37.

Figure 5:
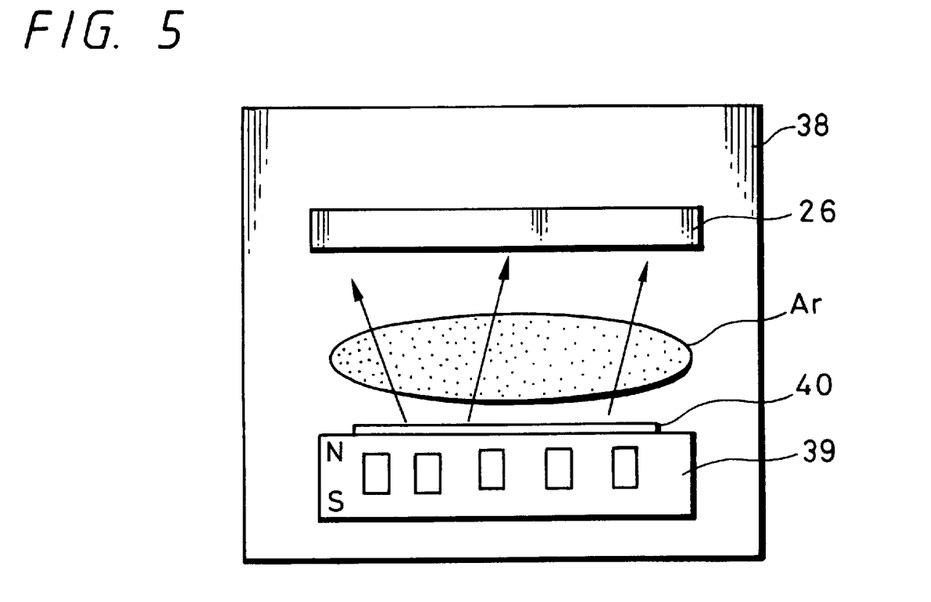
FIG. 5 is a schematic view of another film depositing device which can be used in the examples of the present invention.

A device shown in FIG. 5 includes an ion source 40 as a target on a plasma generating device 39 provided in a vacuum chamber 38, generates a plasma by introducing argon Ar between the target and the substrate 26 located above the target, and forms a film by sputtering.

Figure 7:
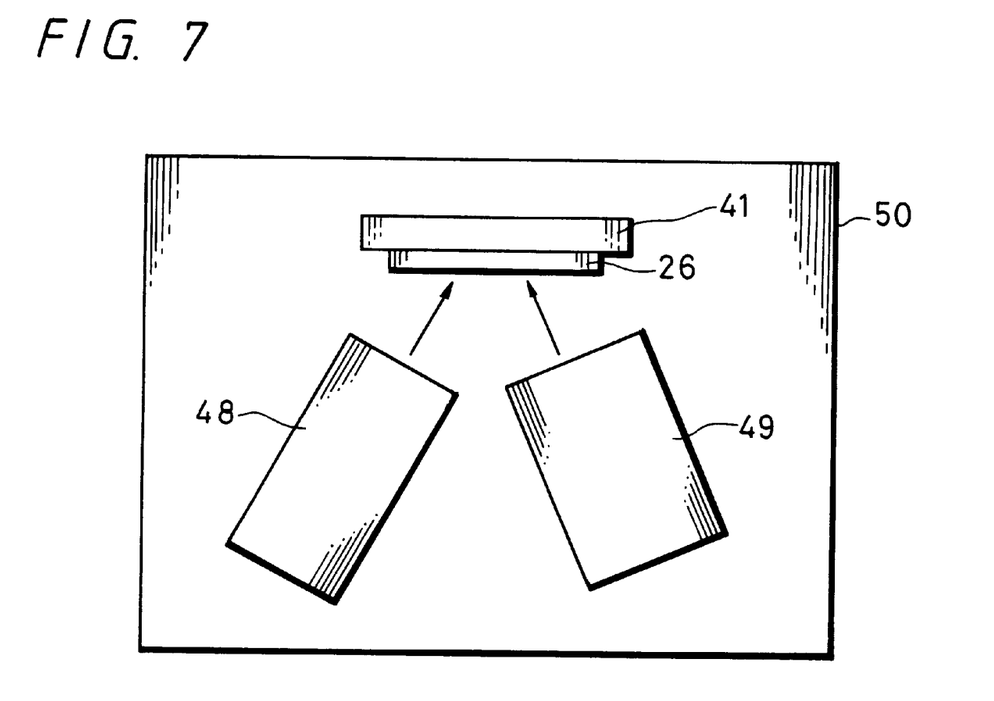
FIG. 7 is a schematic view of a device including the ion implanting device and the film depositing device which can be used in the examples of the present invention.

Such ion implantation and physical film deposition can also be performed by, for example, arranging an ion implanting device 48 and a physical film depositing device 49 to face the substrate 26 supported by a suscepter 41 in the same chamber 50 as shown in FIG. 7.

With the separate use of the above-mentioned ion implanting device and film depositing device suitably according to the application, the ion implanting step and the step of performing ion plating or arc evaporation under a bias electric field after imparting conductivity to the resin by the ion implantation are repeated.

Figure 6:
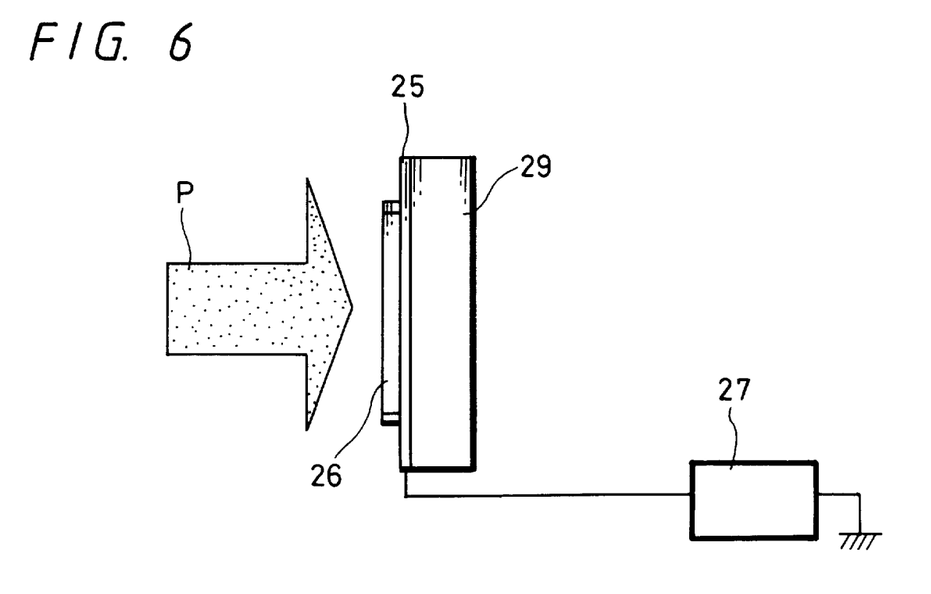
FIG. 6 is a schematic view of a bias means used in the examples of the present invention.

As the bias means of the substrate, as shown in FIG. 6, the substrate 26 to be treated is attached to the substrate holder 25 adjacent to a water-cooled base 29, and a direct current and an alternating current, or an alternating current on which a direct current is superimposed, a pulse voltage, and a pulse voltage on which a direct current is superimposed are applied from the bias power supply 27.

It is preferred to perform ion plating or arc evaporation under a bias electric field after the above-mentioned ion implantation. However, it is also possible to form a thin film with high hardness after the ion implantation, and perform physical film deposition of a thin film with high hardness under lower energy than that in the ion implantation after the ion implantation.

It is also possible to generate a self-bias by ion mixing for performing deposition at the same time as the above-mentioned ion implantation, or insulating the surroundings of the resin to increase the charge during the ion implantation. As a result, the same effect as that produced when the pulse voltage is applied to the substrate is obtained, and the ion implantation and the film deposition are repeated by themselves.

In this case, it is preferred to form a surface hardened layer by applying a direct current bias, alternating current bias or pulse bias as the bias electric field.

Moreover, it is preferred to implant $10^{17}$ or more ions per $cm^2$ into the resin at 20 KeV or less by separately using the ion implanting device or the film depositing device suitably according to the application as described above.

In this case, it is preferred to use carbon ions for the above-mentioned ion implantation. However, it is also possible to use, for example, at least one kind of ions selected from the group consisting of nitrogen ions, titanium ions, tungsten ions, molybdenum ions, and silicon ions.

Furthermore, as the above-mentioned resin, amorphous polyolefine (hereinafter referred to as the "APO") is suitable. However, it is also possible to use, for example, at least one kind of resin selected from the group consisting of polycarbonate, polymethyl methacrylate, acrylic-based resins, polyethylene terephthalate, and high-density polyethylene.

Figure 8:
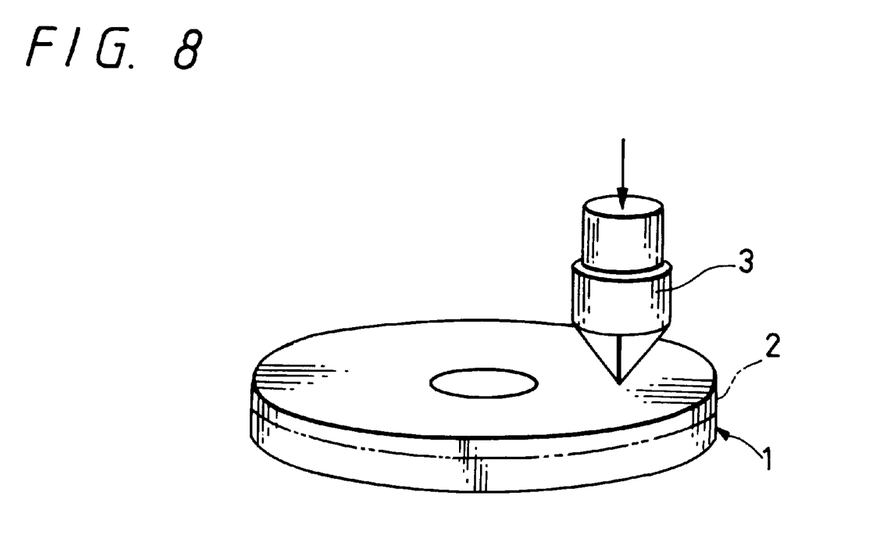
FIG. 8 is a schematic perspective view showing a method of measuring a yield point strength used in the examples of the present invention.

The yield point strength of the surface hardened resin is measured with, for example, a device shown in FIG. 8. Specifically, a triangular-pyramid diamond indenter 3 having a tip with a radius of 0.5 $\mu$m is made in contact with a hardened layer 2 on the surface of a disk 1 and pushed by applying a small load of 0.1 g by a piezoelectric element so as to measure the load distortion.

Thus, the present invention can be used for hardening of the surface of a resin used for an optical disk substrate or magnetic disk substrate.

EXAMPLES

The following descriptions will explain examples of the present invention in great detail.

According to the above-mentioned preferred embodiment of the present invention, the following seven examples were implemented by implanting carbon ions into a one-inch-square APO substrate with the above-mentioned ion implanting device and the film depositing device, reforming the surface of the plastic substrate, and varying the embodiment.

Example 1

Figure 1A:
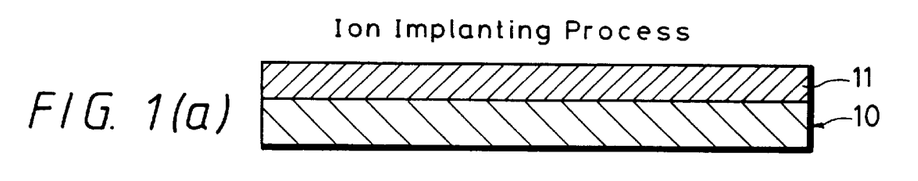
FIGS. 1(a) through 1(d) are schematic views illustrating the processes of hardening a plastic substrate according to examples of the present invention, FIG. 1(a) illustrating ion implantation, FIG. 1(b) illustrating film deposition, FIG. 1(c) illustrating a state after a treatment, and FIG. 1(d) illustrating a treatment in which the film deposition and the ion implantation are performed simultaneously.

With the use of the ion implanting device shown in FIG. 2, after evacuating to a background vacuum of $10^{-7}$ Torr, carbon dioxide was changed into a plasma by the ion source and carbon ions are accelerated and decelerated by mass separation to produce an ion current of 20 KeV, and $10^{16}$ ions per $cm^2$ were implanted into the surface of a substrate 10 as shown in FIG. 1(a) by continuous ion supply at 10 $\mu$A as the ion current so as to form an ion-implanted layer 11. As a result, the Young's modulus of the substrate 10 was 10 GPa.

Figure 1B:
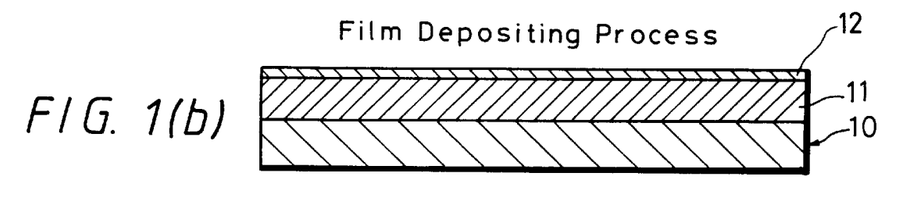

Next, with the use of a cathodic ion source shown in FIG. 4, a film 12 was formed as shown in FIG. 1(b). Like the ion implantation, an arc plasma of 50 V was generated in a carbon solid material in an arc source at a background vacuum of $10^{-7}$ Torr, and an ion current was guided to the substrate 26 with an electromagnetic system. At this time, a bias voltage was applied to the substrate 26 as shown in FIG. 6, the pulse bias source 27 was turned ON at a frequency of 10 Hz, and the substrate 26 was biased to −50 V at a pulse interval of 1:10 by the pulse bias source 27. The film thickness of a formed thin film 12 with high hardness was 20 nm, and no cracks were produced.

Example 2

Like Example 1, with the use of the ion implanting device shown in FIG. 2, after evacuating to a background vacuum of $10^{-7}$ Torr, carbon dioxide was made into a plasma by the ion source, and carbon ions were accelerated and decelerated by mass separation to produce the ion current.

At the beginning of implantation, $10^{16}$ ions per $cm^2$ were implanted into the surface of the substrate 10 as shown in FIG. 1(a) by continuous ion supply at 10 $\mu$A as the ion current at an acceleration voltage of 20 KV. Then, the acceleration voltage was continuously decreased to implant $10^{16}$ ions per $cm^2$, and finally $10^{17}$ ions per $cm^2$ were implanted to form the ion-implanted layer 11. With the same device, finally, a film was formed at 100 V as shown in FIG. 1(b).

Example 3

Like the above-mentioned examples, with the use of the ion implanting device shown in FIG. 2, after evacuating to a background vacuum of $10^{-7}$ Torr, carbon dioxide was made into a plasma by the ion source, and carbon ions were accelerated and decelerated by mass separation to produce an ion current of 20 KeV.

Figure 10:
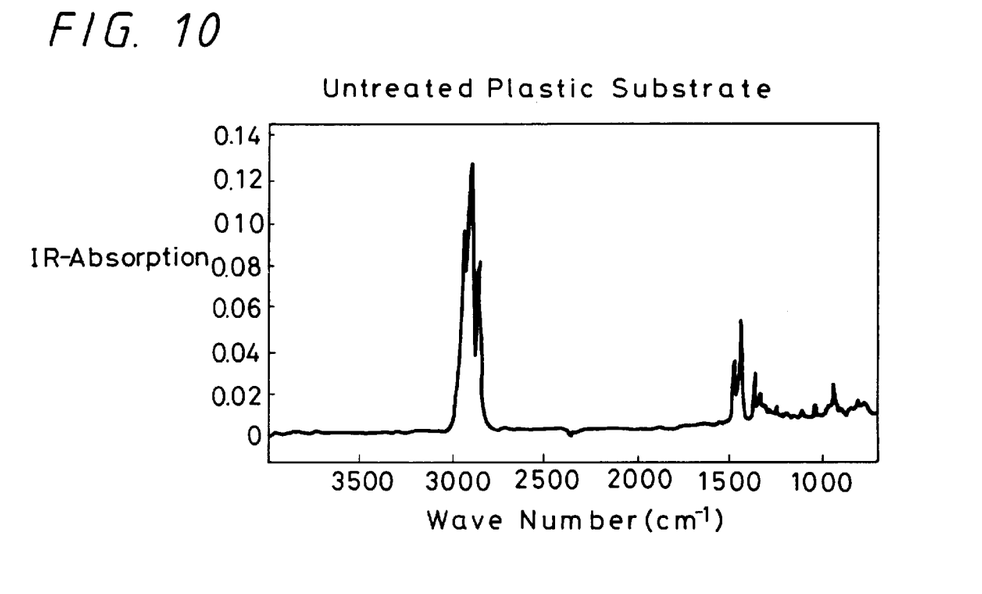
FIG. 10 illustrates, graphically, an infrared absorption spectrum of an untreated plastic substrate of the example of the present invention.

$10^{16}$ ions per $cm^2$ were implanted into the surface of the substrate 10 as shown in FIG. 10(a) by continuous ion supply at 10 $\mu$A as the ion current. Then, after decreasing the conductivity of the substrate 10 to $10^4$ ohm centimeter compared to $10^{14}$ ohm centimeter of the untreated substrate 10 (before ion implantation), an arc plasma of 50 V was generated in the carbon solid material by the cathodic ion source shown in FIG. 4 to form a film with a thickness of 1 nm.

Figure 1C:
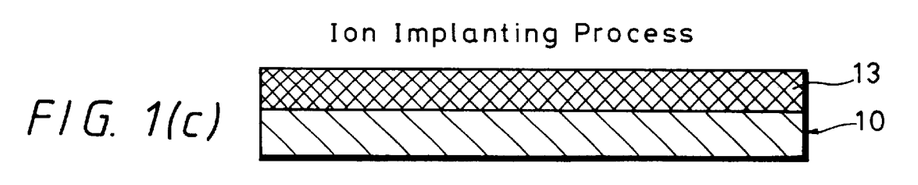

At this time, the ion current guided by the electromagnetic system reached the substrate and formed a film as shown in FIG. 1(b). This operation was repeated 20 times to reform the substrate 10 and form a hardened layer 13 thereon as shown in FIG. 1(c).

Example 4

Like Example 1, with the use of the ion implanting device shown in FIG. 2, after evacuating to a background vacuum of $10^{-7}$ Torr, carbon dioxide was made into a plasma by the ion source, and carbon ions were accelerated and decelerated by mass separation to produce the ion current.

Figure 1D:
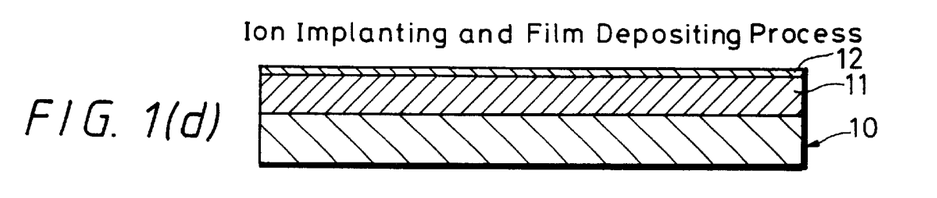

Ions were implanted by continuous ion supply at 10 $\mu$A as the ion current at an acceleration voltage of 20 KV as shown in FIG. 10(d). Next, film deposition was performed on the substrate 10 by the cathodic ion source shown in FIG. 4 without an operating gas. At this time, an arc plasma of 50 V was generated in the carbon solid material, the ion current guided by the electromagnetic system reached the substrate, and a film 12 with a high hardness was formed as shown in FIG. 1(d).

Example 5

Like Example 1, with the use of the ion implanting device shown in FIG. 2, after evacuating to a background vacuum of $10^{-7}$ Torr, carbon dioxide was made into a plasma by the ion source, and carbon ions were accelerated and decelerated by mass separation to produce the ion current.

Ions were implanted by continuous ion supply at 10 $\mu$A as the ion current at an acceleration voltage of 15 KV to form an ion-implanted layer 11 on the surface of the substrate 10 as shown in FIG. 1(a). With the use of the same device, as shown in FIG. 6, a pulse voltage varying between −14 KV to +14 KV was applied to the substrate to be implanted. Furthermore, the implantation was performed by applying the pulse voltage at a pulse ratio of 1:10 and a frequency of 10 Hz.

Example 6

Like Example 1, with the use of the ion implanting device shown in FIG. 2, after evacuating to a background vacuum of $10^{-7}$ Torr, carbon dioxide was made into a plasma by the ion source, and carbon ions were accelerated and decelerated by mass separation to produce an ion current of 8 $\mu$A between 10 KeV and 20 KeV.

With the use of the same device, an ion beam was set so that the ion beam does not overscan the substrate holder, i.e., the ion beam scans only within the substrate holder, and ceramics such as glass, quartz, alumina and BN was attached as an insulating material to the substrate holder so as to reduce and prevent the secondary electrons from the substrate holder.

When a plastic substrate is attached onto the insulating substrate, electric charges are generated on the surface since the plastic is an insulating material. In general, the electric charges are neutralized from the surroundings by the secondary electrons. However, since the secondary electrons are prevented, positive electric charges are generated on the substrate, and 20 KeV as the implantation electric charge is decelerated, thereby producing the same effect as that obtained by the application of the pulse voltage to the substrate. Namely, film deposition and implantation are repeated by themselves.

Example 7

Like Example 1, with the use of the ion implanting device shown in FIG. 2, after evacuating to a background vacuum of $10^{-7}$ Torr, carbon dioxide was made into a plasma by the ion source, and carbon ions were accelerated and decelerated by mass separation to produce an ion current of 20 KeV.

In this case, by continuous ion supply at 10 $\mu$A as the ion current, as shown in FIG. 1(a), only $10^{16}$ ions per cm$^2$ were implanted into the surface of the substrate 10. As a result, Young's modulus of the substrate was 10 GPa.

The hardness and IR (infrared absorption spectrum) of plastics which underwent the surface hardening treatments including the ion implantation and deposition of thin film with high hardness of Examples 1 to 6, the surface hardening treatment including only ion implantation of Example 7, and of plastic which did not undergo such surface hardening treatments were compared and measured. However, since the measurements of the subjects of Examples 1 to 6 show the same result, the data of Example 1 are used.

Figure 9:
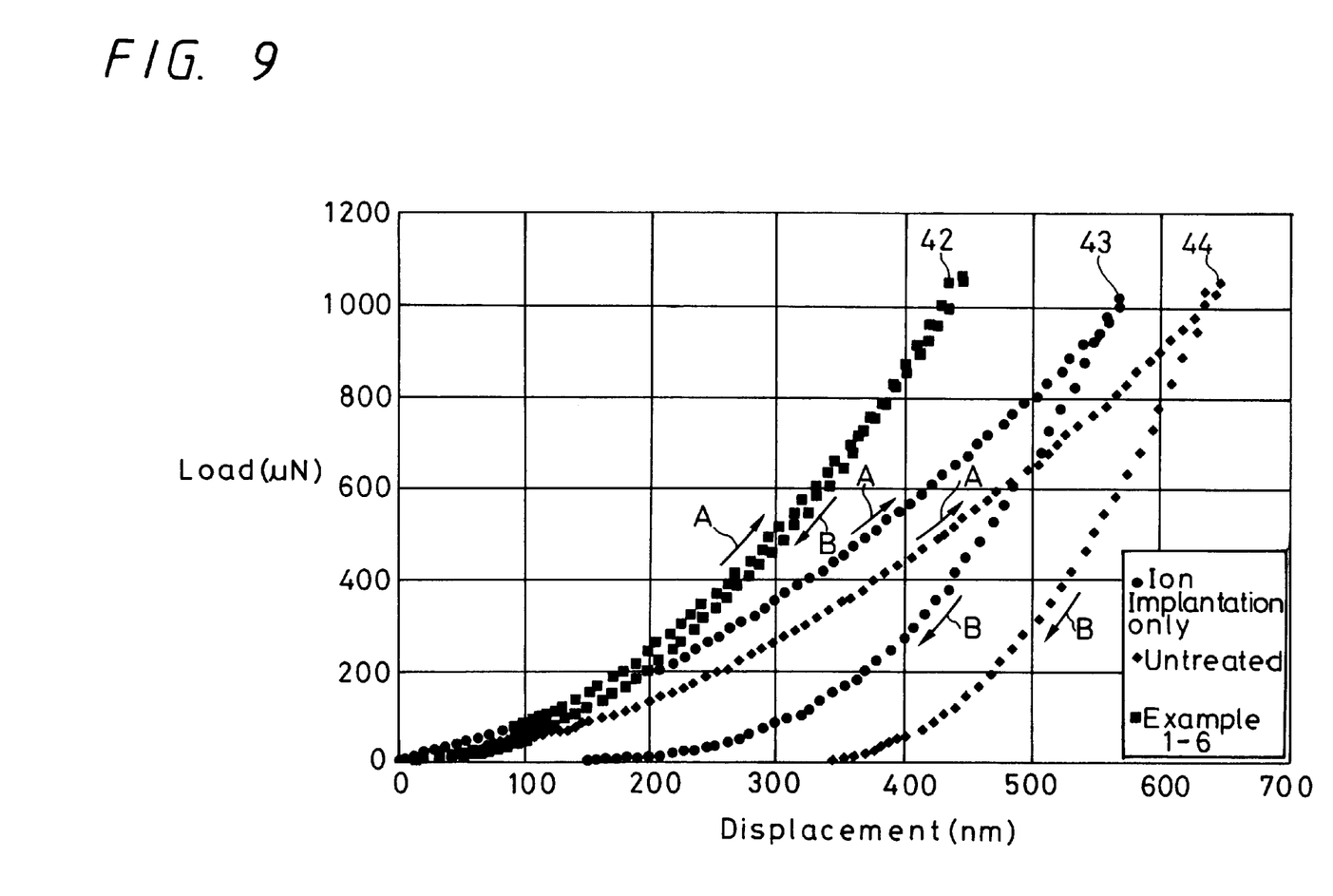
FIG. 9 illustrates, graphically, the results of measurements by the measurement method of the present invention.

FIG. 9 is a graph showing the yield point strength measured by the measurement device shown in FIG. 8. Specifically, in the case of Example 1, a distortion curve 42 of the Example 1 shows a displacement from the zero point due to the load by the piezoelectric element, and returns to the zero point after release. However, in Example 7, since only the ion implantation is performed, a distortion curve 43 thereof shows a big displacement when the load is applied, and does not return to the zero point and keeps showing a slight displacement after release. Moreover, when no surface hardening treatment is applied, a distortion curve 44 thereof shows a bigger displacement and does not return to the zero point after release, and the state of being displaced remains longer In FIG. 9, upward arrows A show displacements when the load is applied, while downward arrows B show changes in the displacements after release.

Thus, it is proved from the results of measurements shown in FIG. 9 that the hardness of surface is higher in Examples 1 to 6 than in Example 7, and the surface is reformed to a surface which is less likely to show plastic deformation.

Figure 11:
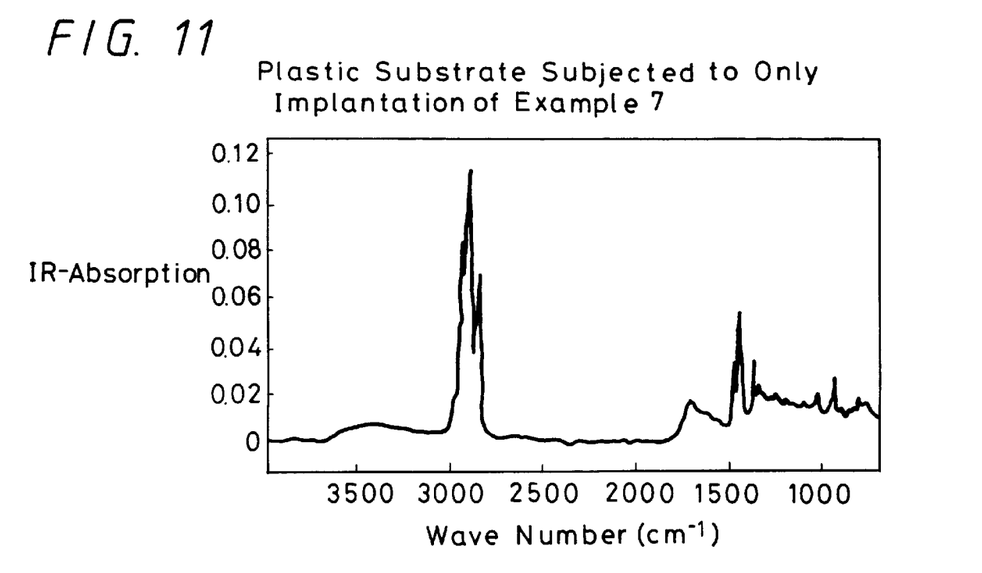
FIG. 11 illustrates, graphically, an infrared absorption spectrum of a plastic substrate to which only the ion implantation was performed according to the example of the present invention.
Figure 12:
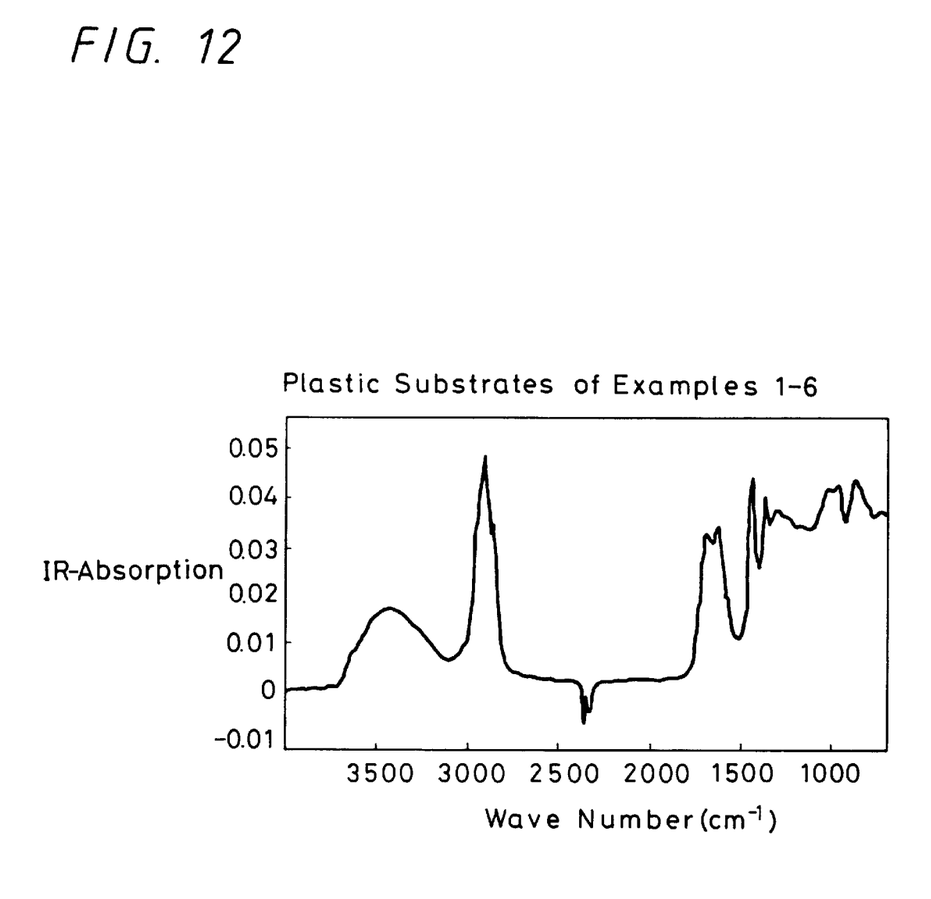
FIG. 12 illustrates, graphically, an infrared absorption spectrum of a plastic substrate after the treatment according to the example of the present invention.

FIGS. 10 to 12 are graphs showing the results of measuring IR of the three plastic substrates.

As shown in FIG. 10, the untreated plastic also contains DLC (diamond like carbon) components, and a single bond element having a peak in the vicinity of a wave number slightly less than 3000 and a double bond element having a peak in the range of a wave number slightly less than 1000 to 1500.

However, as shown in FIG. 11, compared to the untreated substrate, the substrate of Example 7 to which only the ion implantation was performed exhibits peaks more clearly on the whole, especially in the double bond portion.

However, as shown in FIG. 12, in the case of Example 1 in which both the ion implantation and the film deposition were performed, the peaks are shown further clearly on the whole, and both the single bond and the double bond show sharp peaks. Thus, it is proved that the vicinity of the surface of the plastic substrate is reformed to the DLC structure, and that DLC components having an increased amount of double bond carbons are increased in view of the results of the hardness measurements explained with reference to FIG. 9.

Figure 13:
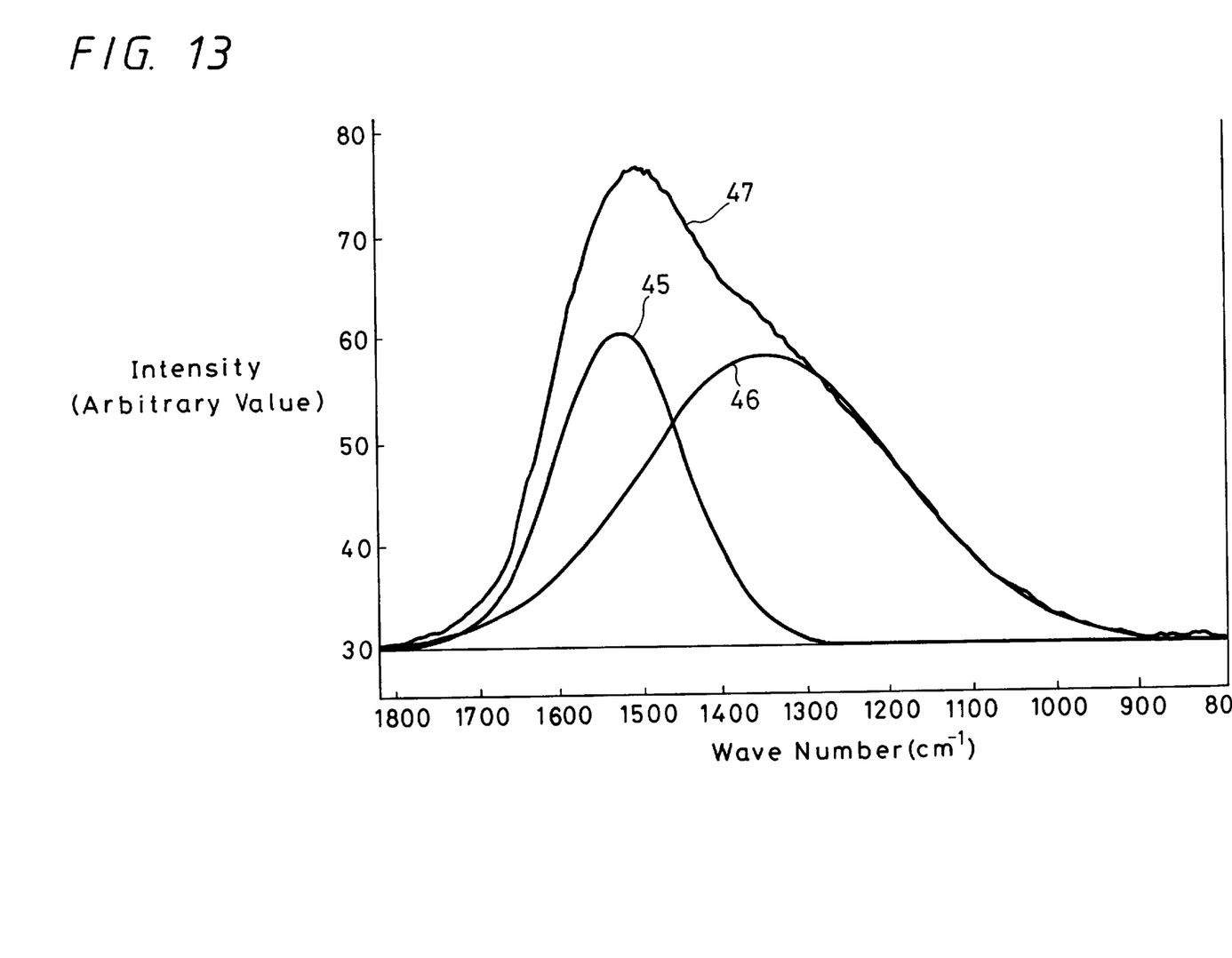
FIG. 13 illustrates, graphically, a Raman spectroscopy spectra of a plastic substrate after the treatment according to the example of the present invention.

FIG. 13 is a graph showing the results of Raman spectroscopy performed with respect to the substrate of Example 1. In this graph, curves 45 and 46 are the analyzed values that show a phenomenon appearing on a substance having the DLC structure, and a waveform line 47 is the measurement value. Namely, the graph shows spectra having a peak at 1350 cm$^{-1}$ and a peak at 1500 cm$^{-1}$, and proves that the substrate has the DLC structure.

The above-mentioned embodiment and examples can be varied in many ways according to the technical concept of the present invention.

For example, the condition of ion implantation and the condition of film deposition can be set to conditions other than those mentioned in the above-mentioned examples. Moreover, the ion implanting device and the film depositing device can be varied in many ways, for example, these devices can be placed in a single chamber as shown in FIG. 7.

Moreover, the examples demonstrate the surface hardening for resins used for a disk substrate for recording information. However, the present invention can also be applied to surface hardening of, for example, resin parts used for insulating materials and mechanical machines other than the disk substrate.

According to the examples, since the ion implantation and the film deposition are performed with respect to a plastic disk substrate under different energy conditions alternately or simultaneously, or by accelerating the ions with a bias, it is possible to implant $10^{17}$ or more ions per $cm^2$ at energy of not higher than 20 KeV. Thus, a hardened layer with no boundary face, which has the same effect as a substrate having a film deposited on an ion-implanted layer, can be formed without additionally depositing a film.

Furthermore, since the ion energy is as low as or lower than 20 KeV, the increase in temperature is small, and the depth of reformed portion is small. Therefore, the present invention produces the effect of reforming the surface layer, and provides a hardness equal to a DLC film used as a conventional protection film. Besides, since the substrate itself is reformed, it is possible to produce a surface state having no cracks and peeling, and prevent the disk from being damaged and unusable even when a head is brought into contact with the surface of the disk.

Additionally, from a production point of view, when $10^{17}$ ions per $cm^2$ are implanted, since the time taken for the implantation is one hour unit, it was difficult to put the technique into practice. However, with the present invention, since the film deposition and the implantation proceed simultaneously, the time taken for the production process is reduced, thereby improving the productivity.

As described above, the present invention applies a surface hardening treatment to a resin to be treated, by alternately performing ion implantation and physical film deposition under a different condition from that for the ion implantation, or simultaneously performing the ion implantation and the physical film deposition, or by further implanting ions under the influence of a bias electric field. It is therefore possible to form alternately or simultaneously a thin or shallow ion-implanted layer and a physically deposited film layer on the surface of the resin under low energy, and harden the surface of the resin without a boundary face in substantially the same manner as in the case where the physically deposited film is formed on the ion-implanted layer. Moreover, if a bias electric field is applied, the implantation ions are accelerated to improve the implantation efficiency, and the hardening rate can be increased. As a result, for example, if the surface of the resin is reformed to a material rich in the DLC structure and if this material is applied to a disk substrate, it is possible to produce a good-quality product having no cracks or the like in a short time, thereby improving the productivity.

Next, the present invention will be explained with reference to a preferred embodiment in applying the present invention, for example, to information carrier-use resin disk substrates, such as an optical disk substrate, a magnetic disk substrate and so on.

Figure 14:
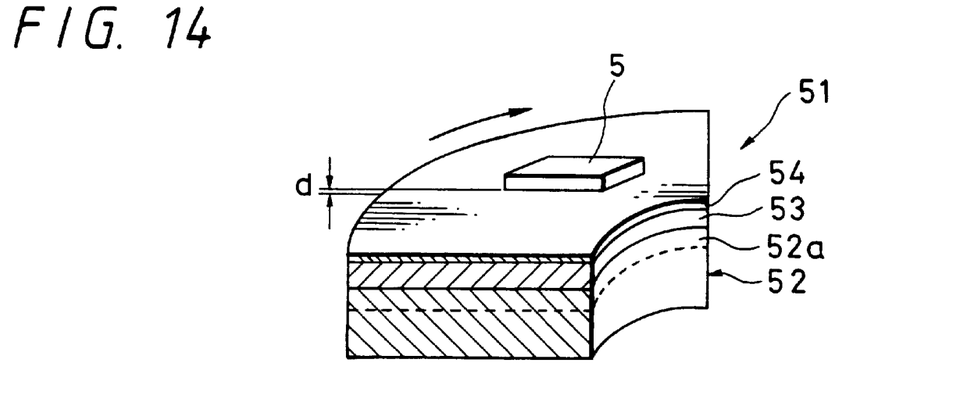
FIG. 14 is a schematic perspective view showing a magnetic disk using an amorphous polyolefine-made substrate according to an embodiment of the present invention, and a head.

FIG. 14 is a schematic perspective view showing an amorphous polyolefine (hereinafter referred to as the "APO") magnetic disk (showing one portion of the disk being cut into four portions) according to the embodiment of the present invention and a head.

As illustrated in FIG. 14, by performing the ion implantation of the embodiment on an amorphous polyolefine substrate (hereinafter referred to as the "substrate") of high purity, DLC including many SP3 components is formed on the surface of a substrate 52, and a magnetic layer 53 and a protection layer 54 are formed on the substrate 52. However, in the case of an optical disk, a dielectric layer is formed instead of the magnetic layer 53.

By this ion implantation, as shown in FIG. 14, a hardened layer 52a is formed on a surface of the substrate 2, on which surface the magnetic layer 53 is to be formed, thereby improving the surface hardness. As the implantation ions, carbon ions, argon ions, nitrogen ions and silicon ions are used. However, in this embodiment, an example in which the carbon ions are implanted will be explained.

It is preferred to achieve the improvement of the surface hardness so that the surface hardness (Hv) falls within the range between Hv500 and 3000. If the surface hardness is too small, the substrate is easily damaged by contact with a recording or reproducing mechanism, for example, an optical pickup.

Moreover, the dose amount of carbon ions is preferably within the range between $10^{17}$ and $5\times10^{17}/cm^2$, and more preferably within the range between $10^{17}$ and $10^{22}/cm^2$. If the concentration is too low, the above-mentioned effect of improving the surface hardness may not be obtained.

Furthermore, if the thickness of the ion-implanted layer 52a is too thin, there is a possibility that the above-mentioned effect of improving the surface hardness is not been obtained. On the other hand, if the thickness is too thick, the surface is deformed easily by the stress. As a surface reformed layer, a thickness equal to or more than 0.05 $\mu$m is required, and a thickness of up to 0.2 $\mu$m is required against crashing into a head. It is difficult for conventional thin films to satisfy the requirements. However, the requirements can be easily satisfied by the ion implanting method of the present invention.

Figure 15:
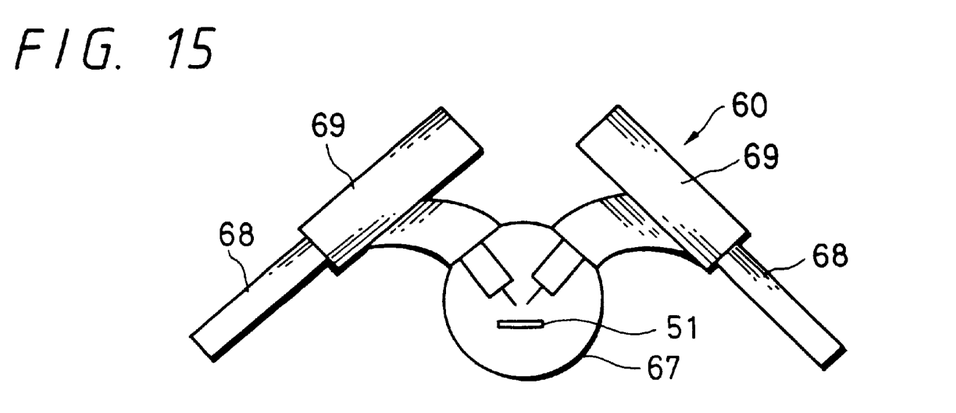
FIG. 15 is a schematic view showing a mass-separating type ion implanting device used in the embodiment of the present invention.

In order to achieve high purity and high vacuum, this hardening treatment used a mass-separation type ion source 60 shown in FIG. 15. As the degree of background vacuum, in a vacuum atmosphere of $10^{-8}$ Torr, carbon ions are generated from $CO_2$ gas by a microwave type ion source. In this case, only carbons reach the substrate, carbons between 10 KeV and 80 KeV reach the substrate by accelerating and decelerating the ions by a magnet and an ion transport system.

Then, carbon positive ions of 20 KeV were implanted into the surface of the substrate 52 by the mass-separating type ion source 60. Three kinds of samples were prepared by implanting $10^{16}$ ions, $10^{17}$ ions, and $5\times10^{17}$ ions per $cm^2$ respectively, and tested. Regarding the depth of implantation, according to the calculation by a trim software used as a computer software for SIMS, it was possible to implant ions to around a depth of around 0.1 $\mu$m from the surface for 20 KeV.

According to the Raman spectroscopy results, even after the ion implantation, spectrum B of the Raman spectroscopy representing the implantation of $10^{16}$ ions per $cm^2$ shows that the original structure (for example, benzene) is still present in the surface layer of the substrate. Whereas spectrum (A) representing the implantation of $10^{17}$ or more ions per $cm^2$ shows that the original structure disappears and the DLC structure appears. The enlarged portions correspond to the results of normal Raman spectroscopy shown in documents.

Namely, the above-mentioned results show that the surface of the substrate has the DLC structure by the ion implantation, and the yield point strength thereof is improved. The improvement of the yield point strength can be proved by the following facts.

Figure 16:
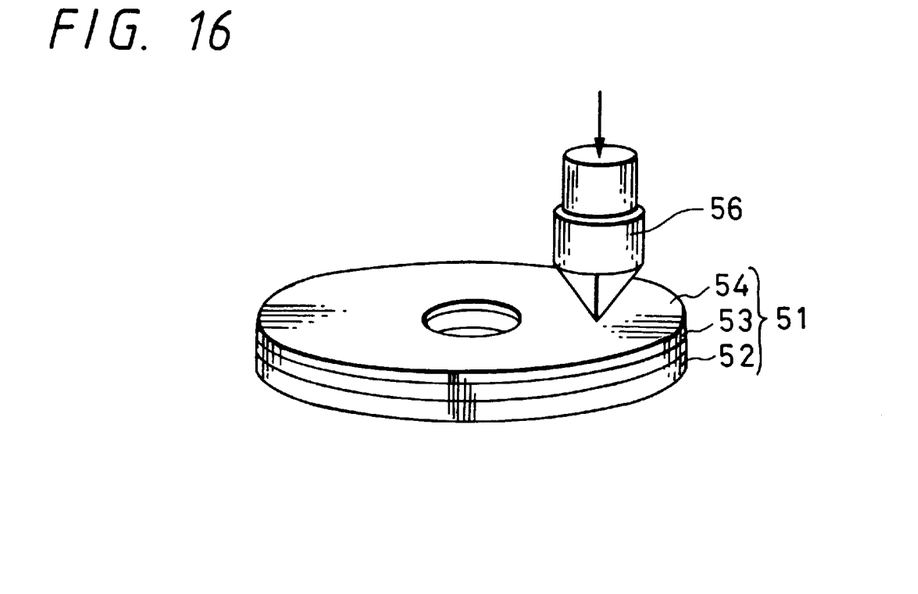
FIG. 16 is a schematic perspective view showing a method of measuring the yield point strength according to the embodiment of the present invention.

FIG. 16 is a schematic perspective view showing a method of measuring the yield point strength. In this method, a triangular-pyramid diamond indenter 56 having a tip with a radius of 0.5 μm is brought in contact with the surface of the disk 51 and pushed by applying a small load of 0.1 g by a piezoelectric element, and the load distortion is measured.

Figure 17:
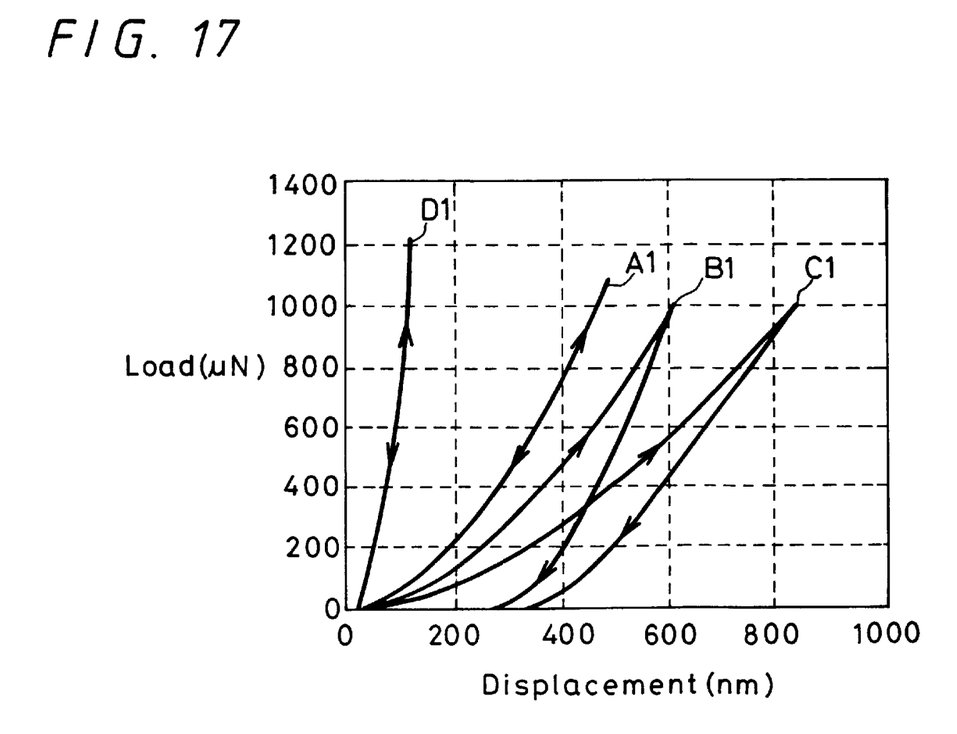
FIG. 17 illustrates, graphically, distortion curves due to load of the present invention.

FIG. 17 is a graph showing the results of the measurements. In this graph, A1 is a distortion curve when $10^{17}$ ions per $cm^2$ were implanted, B1 is a distortion curve when $10^{16}$ ions per $cm^2$ were implanted, C1 is a distortion curve when no ions were implanted, and D1 is a distortion curve of glass presented for the purpose of comparison with the ion implantation.

According to the graph, it was found that curves C1 and B1 without the ion implantation do not return to the original position and have plastic deformation generated. On the other hand, it was found that the Sample with the curve A1 has such a characteristic that curve A1 returns to the original position and has the coping property within elastic deformation, and the substrate surface is hardened to a hardness near the curve D1 of Glass. It is thus preferred to implant equal to or more than $10^{17}$ ions per $cm^2$.

This embodiment applies such a phenomenon as a measure to counter the deformation caused by crashing of a recording and reproducing head against an optical disk or magnetic disk, forms a hardened region without a boundary face by the ion implantation, instead of a thin film, and fabricate a disk substrate which does not have cracks or plastic deformation.

Differently from a layer formed by vapor deposition, the DLC layer of this embodiment has an inclining composition. Therefore, the substrate does not show a change with time due to degassing from a crack or deformed portion. For example, like a conventional CD disk, in order to form an aluminum film closely, when aluminum is vapor-deposited on a material prepared by subjecting, for example, an acrylic material or the like to a plasma treatment, there is a problem that a gas which has not been decomposed is generated from the inside and affects aluminum on the surface. However, such a problem did not occur in the ion implantation at high energy of the present invention. Regarding the hardness, a surface having hardness close to glass was obtained. If such a surface is combined with the surface protection film on the recording layer, it is very effective for the disk.

Besides, in above-mentioned Raman spectroscopy, for polymers, the effect of fluorescence viciously affects the resolution at 1500 $cm^{-1}$. Therefore, in order to remove the effect, it is possible to perform measurements with laser wavelength of 633 nm, 266 nm and 214 nm other than argon laser of 514 nm. Hence, the reliability of this embodiment was confirmed.

As a method of implanting ions into the substrate, a method of high purity and high vacuum similar to the above-mentioned method has been known. In this method, ions generated by a cathodic arc device are accelerated and implanted at a later stage.

According to this embodiment, by implanting ions by setting the dose amount equal to or more than $10^{17}/cm^2$ and the implanting energy to 20 KeV, it is possible to implant ions rich in SP3 and reform the surface to be treated to a hardness which does not show plastic deformation. Therefore, if this technique is applied to the fabrication of an optical disk or magnetic disk, even when a flying head used for recording and reproduction comes into contact with the surface of the disk, it is possible to prevent the disk from being damaged and unusable for use.

As described above, according to the present invention, the surface is sufficiently reformed, a hardness similar to that of a DLC film used as a conventional protection film is obtained, and a surface state having no cracks and peeling can be obtained because the substrate itself is reformed.

In the above-mentioned embodiment, it is possible to control the concentration and depth by using argon, nitrogen or silicon ions as the implantation ions, changing the implantation energy, or changing the time. Additionally, it is possible to use an acrylic-based resin, polyethylene terephthalate, polycarbonate or high-density polyethylene as the material for the substrate.

As described above, the present invention is a resin-made disk substrate for supporting an information recording layer, and a hardening treatment by ion implantation has been applied to at least a surface on a side supporting the information recording layer. Therefore, the surface of the resin is reformed, cracking or plastic deformation does not occur, and a disk substrate having a sufficient surface hardness can be obtained. Thus, if such a disk substrate is used as a disk-shaped information carrier, it is possible to prevent the disk from being damaged by shock caused when a head is brought into contact with the disk during recording and reproduction.

Having described preferred embodiments of the invention with reference to the accompanying drawings, it is to be understood that the invention is not limited to specific embodiments and that various changes and modifications could be effected therein by one skilled in the art without departing from the spirit or scope of the invention as defined in the appended claims.

What is claimed:

1. A method for hardening a resin surface comprising the steps of:
   performing a carbon or silicon ion implantation on a surface of a resin under a first condition so as to implant ions equal to or more than $10^{17}$ ions per $cm^2$ at equal to or less than 20 KeV; and
   performing a physical film deposition on a surface of the resin under a second condition different from said first condition for the ion implantation, to harden the surface of the resin.

2. The method of claim 1 wherein the ion implantation and the physical film deposition are performed alternatingly and repeatedly by varying an ion energy.

3. The method of claim 1 wherein the ion implantation step and the physical film deposition step are performed under a bias electric field.

4. The method of claim 1 wherein the physical film deposition is performed under a bias electric field and after the ion implantation.

5. The method of claim 4, wherein the physical film deposition is performed by ion plating or arc evaporation.

6. The method of claim 1 wherein the physical film deposition is performed after the ion implantation.

7. The method of claim 6 wherein the physical film deposition is performed at a lower energy than the ion implantation.

8. The method of claim 1 wherein the resin is selected from the group consisting of polycarbonate, polymethyl methacrylate, amorphous polyolefine, acrylic resin, polyethylene terephthalate, and high-density polyethylene.

9. The method of claim 1 wherein the resin is applied to a disk substrate selected from the group consisting of an optical disk substrate, a magnetic disk substrate and a magneto-optics disk substrate.

10. The method of claim 1 wherein during the ion implantation step, an ion beam is set so as not to overscan a substrate holder.

11. A method for hardening a resin surface comprising carbon or silicon ion implantation so as to implant ions equal to or more than $10^{17}$ ions per cm$^2$ at equal to or less than 20 KeV and a physical film deposition on a surface of a resin, to harden the surface of the resin.

12. The method of claim 11 wherein the physical film deposition comprises vapor deposition.

13. The method of claim 11 wherein the ion implantation further comprises generating a self-bias by insulating surroundings of the resin to increase charges during said ion implantation.

14. The method of claim 11 wherein the resin is selected from the group consisting of polycarbonate, polymethyl methacrylate, amorphous polyolefine, acrylic resin, polyethylene terephthalate, and high-density polyethylene.

15. The method of claim 11 wherein the resin is applied to a disk substrate selected from the group consisting of an optical disk substrate, a magnetic disk substrate and a magneto-optics disk substrate.

16. The method of claim 11 wherein, during the ion implantation, an ion beam is set so as not to overscan a substrate holder.

17. A method for hardening a resin surface comprising carbon or silicon ion implantation on a surface of a resin so as to implant ions equal to or more than $10^{17}$ ions per cm$^2$ at equal to or less than 20 KeV under influence of a bias electric field, to harden the surface of the resin.

18. The method of claim 17 wherein the bias electric field is produced by a bias selected from the group consisting of a direct current bias, an alternating current bias and a pulse bias.

19. The method of claim 17 wherein the resin is selected from the group consisting of polycarbonate, polymethyl methacrylate, amorphous polyolefine, acrylic resin, polyethylene terephthalate, and high-density polyethylene.

20. The method of claim 17 wherein the resin is applied to a disk substrate selected from the group consisting of an optical disk substrate, a magnetic disk substrate and a magneto-optics disk substrate.

21. The method of claim 17 wherein during the ion implantation, an ion beam is set so as not to overscan a substrate holder.

* * * * *